US009112166B2

(12) United States Patent
Gaynor et al.

(10) Patent No.: US 9,112,166 B2
(45) Date of Patent: Aug. 18, 2015

(54) CONDUCTIVE FILMS

(75) Inventors: Whitney Gaynor, Palo Alto, CA (US);
Peter Peumans, Sunnyvale, CA (US)

(73) Assignee: The Board of Trustees of the Leland Stanford Junior Univerity, Palo Alto, CA (US)

( * ) Notice: Subject to any disclaimer, the term of this patent is extended or adjusted under 35 U.S.C. 154(b) by 761 days.

(21) Appl. No.: 13/194,134

(22) Filed: Jul. 29, 2011
(Under 37 CFR 1.47)

(65) Prior Publication Data

US 2012/0127097 A1 May 24, 2012

Related U.S. Application Data

(60) Provisional application No. 61/369,493, filed on Jul. 30, 2010.

(51) Int. Cl.
*H01L 51/44* (2006.01)
*G06F 3/041* (2006.01)
*B82Y 20/00* (2011.01)
*B82Y 30/00* (2011.01)
*H01L 51/00* (2006.01)

(52) U.S. Cl.
CPC .............. *H01L 51/444* (2013.01); *B82Y 20/00* (2013.01); *B82Y 30/00* (2013.01); *G06F 3/041* (2013.01); *G06F 3/0412* (2013.01); *H01L 51/442* (2013.01); *H01L 51/445* (2013.01); *H01L 51/0037* (2013.01); *Y02E 10/549* (2013.01); *Y10T 428/2495* (2015.01); *Y10T 428/24355* (2015.01)

(58) Field of Classification Search
CPC ............................ G06F 3/0412; H01L 51/442
See application file for complete search history.

(56) References Cited

U.S. PATENT DOCUMENTS

| 4,370,697 | A | 1/1983 | Haberl et al. |
| 5,225,959 | A | 7/1993 | Stearns |
| 6,936,761 | B2 * | 8/2005 | Pichler .......................... 136/256 |
| 7,179,561 | B2 | 2/2007 | Niu et al. |
| 7,553,371 | B2 * | 6/2009 | Dubrow et al. ................. 117/90 |
| 7,609,178 | B2 | 10/2009 | Son et al. |

(Continued)

FOREIGN PATENT DOCUMENTS

| WO | 2008046058 | | 4/2008 |
| WO | 2009123388 | A1 | 10/2009 |

(Continued)

OTHER PUBLICATIONS

News Release. "PPS Enters OEM Market with New Line of Digital Tactile Sensors." Pressure Profile Systems, Inc., Los Angeles, CA, 1 pg. (Mar. 3, 2006). http://www.pressureprofile.com.

(Continued)

*Primary Examiner* — Evan Pert
(74) *Attorney, Agent, or Firm* — Crawford Maunu PLLC

(57) ABSTRACT

Conductive films with transparency characteristics are provided. In accordance with various example embodiments, a transparent conductive film includes an inorganic nanowire mesh embedded in an organic substrate layer. The embedding may involve, for example, embedding a majority of, or substantially all of the nanowire mesh in the organic substrate layer to facilitate a resulting surface roughness of the combined nanowire mesh-polymer that is less than a surface roughness of the mesh alone (e.g., or otherwise embedded), and in turn facilitates desirable conductivity characteristics.

16 Claims, 7 Drawing Sheets

(56) References Cited

U.S. PATENT DOCUMENTS

| | | | |
|---|---|---|---|
| 8,018,568 B2 * | 9/2011 | Allemand et al. | 349/187 |
| 8,025,960 B2 * | 9/2011 | Dubrow et al. | 428/304.4 |
| 8,049,333 B2 * | 11/2011 | Alden et al. | 257/741 |
| 8,127,623 B2 | 3/2012 | Son et al. | |
| 8,198,796 B2 * | 6/2012 | Takada | 313/352 |
| 8,272,276 B2 | 9/2012 | Gorjanc et al. | |
| 8,304,984 B2 * | 11/2012 | Koyama et al. | 313/504 |
| 8,323,744 B2 * | 12/2012 | Connor et al. | 427/383.1 |
| 8,414,961 B1 * | 4/2013 | Robinson et al. | 427/74 |
| 8,460,747 B2 * | 6/2013 | Veerasamy | 427/122 |
| 8,513,804 B2 * | 8/2013 | Hellstrom et al. | 257/741 |
| 8,518,472 B2 * | 8/2013 | Veerasamy | 427/58 |
| 8,546,684 B2 * | 10/2013 | Nojima et al. | 136/256 |
| 8,592,804 B2 * | 11/2013 | Rand et al. | 257/40 |
| 8,604,332 B2 * | 12/2013 | Veerasamy | 136/243 |
| 8,609,975 B2 * | 12/2013 | Veerasamy | 136/243 |
| 8,618,531 B2 * | 12/2013 | Alden et al. | 257/40 |
| 8,648,525 B2 * | 2/2014 | Chiba et al. | 313/503 |
| 8,697,180 B2 * | 4/2014 | Veerasamy | 427/112 |
| 2003/0099884 A1 | 5/2003 | Chiang et al. | |
| 2007/0227267 A1 | 10/2007 | Loeb et al. | |
| 2008/0087069 A1 | 4/2008 | Renken et al. | |
| 2008/0132313 A1 | 6/2008 | Rasmussen et al. | |
| 2008/0259262 A1 | 10/2008 | Jones et al. | |
| 2009/0027184 A1 | 1/2009 | Forster | |
| 2009/0185327 A1 | 7/2009 | Seymour | |
| 2009/0237374 A1 | 9/2009 | Li et al. | |
| 2009/0283304 A1 * | 11/2009 | Winoto | 174/257 |
| 2010/0033059 A1 | 2/2010 | Choi et al. | |
| 2010/0105443 A1 | 4/2010 | Vaisanen | |
| 2010/0178417 A1 | 7/2010 | Connor et al. | |
| 2010/0308844 A1 | 12/2010 | Day et al. | |
| 2011/0018424 A1 | 1/2011 | Takada | |
| 2011/0025631 A1 | 2/2011 | Han | |
| 2011/0256451 A1 | 10/2011 | Cui et al. | |
| 2011/0285019 A1 * | 11/2011 | Alden et al. | 257/741 |
| 2011/0297642 A1 * | 12/2011 | Allemand et al. | 216/13 |
| 2012/0272751 A1 | 11/2012 | Gorjanc et al. | |
| 2013/0032204 A1 * | 2/2013 | Gaudiana et al. | 136/256 |
| 2013/0098436 A1 * | 4/2013 | Connor et al. | 136/256 |
| 2013/0260550 A1 * | 10/2013 | Veerasamy | 438/610 |

FOREIGN PATENT DOCUMENTS

| | | |
|---|---|---|
| WO | 2010010838 | 1/2010 |
| WO | 2010082428 | 7/2010 |

OTHER PUBLICATIONS

T.W. Lee, J. Zaumseil, Z. Bao, J.W.P. Hsu, J.A. Rogers, "Organic Light-emitting Diodes Formed by Soft Contact Lamination," Proc. Natl. Acad. Sci., vol. 101, p. 429-433, (2004).

A.L. Briseno, S.C.B. Mannsfeld, M.M. Ling, S. Liu, R.J. Tseng, C. Reese, M.E. Roberts, Y. Yang, F. Wudl, Z. Bao, "Large-area Patterning of Organic Single-crystal Arrays," Nature 2006, vol. 444, p. 913-917 (2006).

C.K. Tee, "High Sensitivity, Large Area, Flexible, Passive and Active Pressure Sensors Employing Structured Elastomeric Films," Abstract and Presentation. MRS Fall Meeting, (Dec. 2009).

L. Bergeron, "Stanford researchers' new high-sensitivity electronic skin can feel a fly's footsteps," Stanford Report, (Sep. 2010).

S.C.B. Mannsfeld, et al, "Highly sensitive flexible pressure sensors with microstructured rubber dielectric layers," Nature Materials, vol. 9, pp. 859-864 (2010).

"Electronic skin may someday restore touch," abc7news.com, 2011. Article accompanying video (1 pg).

B. Gruber, "From Star Wars to Stanford—scientists develop artificial skin," Reuters.com, Feb. 2011. Video Transcript, 1 pg.

Darlinski et al. "Mechanical force sensors using organic thin-film transistors," Journal of Applied Physics, vol. 97, pp. 1-4, (2005).

\* cited by examiner

CONDUCTIVE FILMS

RELATED PATENT DOCUMENT

This patent document claims benefit under 35 U.S.C. §119 to U.S. Provisional Patent Application Ser. No. 61/369,493, entitled "Transparent Conductive Films" and filed on Jul. 30, 2010; this patent document and the Appendices filed in the underlying provisional application, including the references cited therein, are fully incorporated herein by reference.

FIELD

The present invention relates generally to conductors, and more specifically to transparent conductive films and methods therefore.

BACKGROUND

A variety of materials have been used for transparent conductors (conductors passing at least some, if not a majority, of light incident thereupon). Such conductors are used, for example, with optoelectronic devices, displays and touch screens. One type of material that has been used with these devices is tin-doped indium oxide (ITO). However, ITO is relatively expensive, can be expensive to form, and can further be brittle. Other materials have been difficult to implement, due to a variety of characteristics such as cost and difficulty in their implementation, or insufficient performance (e.g., insufficient transparency, insufficient conductivity, and related tradeoffs).

These and other issues remain as a challenge to a variety of methods, devices and systems that use or benefit from transparent conductive films.

SUMMARY

Various aspects of the present invention are directed to devices, methods and systems involving transparent conductive films that address challenges including those discussed above.

According to an example embodiment, a transparent conductive film includes an organic substrate layer and an inorganic nanowire mesh embedded in the organic substrate layer. The embedded mesh can be implemented with a variety of electronic devices, such as those employing or otherwise benefiting from conductive material in a transparent film.

Another example embodiment is directed to a method for forming a transparent conductive film. An inorganic nanowire mesh is introduced to a polymer, such as by depositing or otherwise contacting the mesh to the polymer. The nanowire mesh is then embedded in the polymer.

Various embodiments are directed to forming a nanowire mesh/polymer composite film in which the polymer is used to provide a film having a smooth surface relative, for example, to the surface of the nanowire mesh.

Other embodiments are directed to devices incorporating one or more aspects of a nanowire mesh/polymer film. Such embodiments may involve one or more of an optoelectronic device, a photovoltaic device, a touch screen, a solar cell and an organic-based light-emitting display.

Still other embodiments are directed to methods for manufacturing a device incorporating a nanowire mesh/polymer film. Such approaches may be applicable, for example, to forming an optoelectronic device, a photovoltaic device, a touch screen, a solar cell or an organic-based light-emitting display.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which:

FIG. 1 shows a nanowire mesh type device undergoing manufacture, according to an example embodiment of the present invention, and in which

Figure 1A:
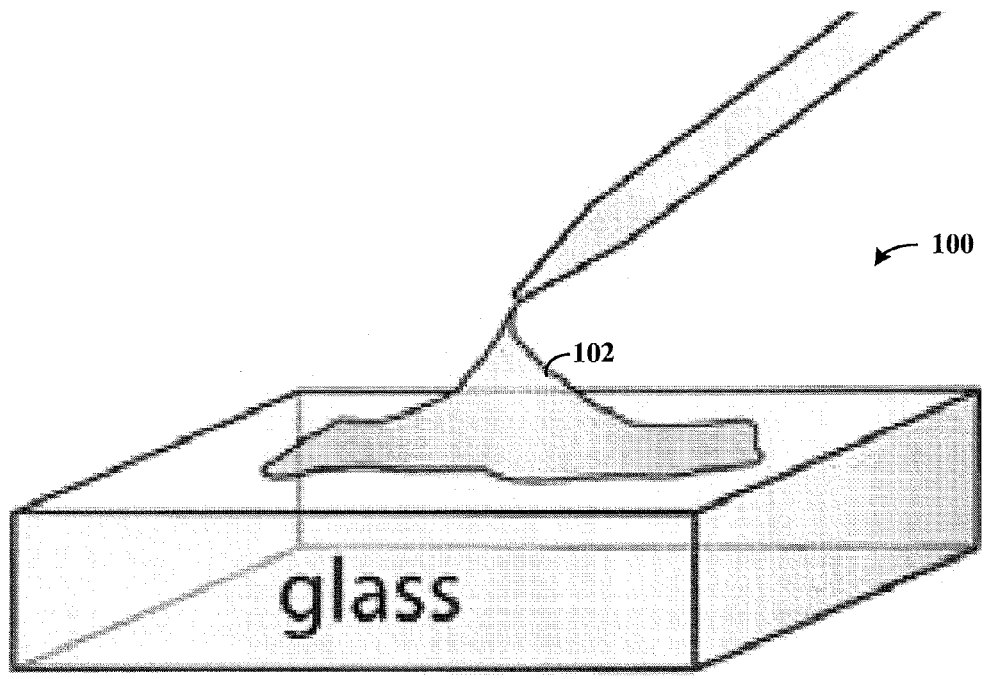
FIG. 1A shows a glass substrate with nanowire suspension applied thereto.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to transparent and semi-transparent conductors as described herein. While the present invention is not necessarily limited, various aspects of the invention may be appreciated through a discussion of examples using these and other contexts. The following discussion, as well as that in the Appendices that form part of this patent document, describe various exemplary embodiments without limitation to other related embodiments and/or subject matter herein.

Various example embodiments are directed to solution-processed transparent conductors, which can be implemented on flexible substrates. Some embodiments are directed to a composite solution-processed material for forming transparent conductors used in optoelectronic devices. For some applications, the composite solution-processed material can be used in devices that have employed indium-tin-oxide material as a conductor.

As applicable with various embodiments, it has been discovered herewith that the morphology of silver nanowires as related to surface roughness may have a strong negative effect on device performance. Accordingly, various embodiments are directed to controlling or smoothing surface roughness corresponding to nanowire mesh films, by embedding nanowire mesh films into a polymer (e.g., a conducting polymer) or other type of film, or forming nanowire-including films having desirable surface characteristics. This approach can be used, for example, to set or improve the conductance or other properties of the film. In many embodiments, the resulting nanowire mesh/polymer film exhibits a surface roughness that is substantially less than a surface roughness of the nanowire mesh. For example, a surface roughness that is substantially less for a film of nanowires having diameters ranging from 50 nm to 100 nm, is a surface roughness of between about 5 nm and 30 nm RMS (root mean squared), or less than about 20 nm RMS. A surface roughness that is not substantially less for such nanowire diameter ranges is 50 nm RMS.

Nanowires may be embedded as discussed herein using one or more of a variety of approaches. In some embodiments, nanowires are embedded under conditions in which junctions between wires in the wire mesh make intimate contact and fuse together such that the sheet resistance of the composite is reduced, relative to the resistance of the wire mesh, prior to embedding. In certain embodiments, junctions between the wires in the wire mesh are directed away from the top surface and down into the underlying film, reducing surface roughness (e.g., the underlying film is used to fill space between the nanowires). The underlying film mechanically anchors the nanowire mesh, and mitigates the removal or alteration of wires by small shear forces, which can be further used to facilitate high-temperature processing otherwise not available for meshes susceptible to mechanical disturbance. Embedding pressure can be used to control the haze of the film, which is proportional to the surface roughness (e.g., rougher films exhibit higher haze, which may scatter light through the film).

In connection with various example embodiments, a nanowire mesh is first formed, separate from a polymer, to set connectivity characteristics of the nanowire mesh. This approach can be used to improve mesh connectivity relative, for example, to resulting performance of the mesh. The nanowire mesh is then embedded in a polymer, resulting in an inorganic-organic composite structure exhibiting desirable sheet resistance for a given transparency. Such an approach can be used to form flexible roll-to-roll fabricated organic photovoltaic (OPV) cells, which can be used for a variety of rigid and flexible thin-film solar cells and displays.

Other embodiments involve a nanowire mesh embedded into a substrate having a relatively high refractive index medium, to extend the spectral range over which the wire mesh is transparent further into the infrared. This approach, which may involve the step of embedding the mesh, can be carried out using the substrate to effectively "shrink" the wavelength of incident light, and can be used to achieve longer wavelengths to squeeze through the holes between nanowires.

In many embodiments, thickness of a polymer film is set relative to characteristics of a nanowire mesh to be embedded in the polymer film, to achieve a resulting film conductivity and thickness. For instance, by using a polymer having a thickness that is about equal to or greater than the thickness of a nanowire mesh to be embedded therein, the resulting nanowire mesh/polymer film can be formed to exhibit desirable conductivity (e.g., to address roughness issues as described in the Appendices), while maintaining a relatively thin profile. In some embodiments, the thickness of the film is set to achieve a desired/target conductivity characteristic, and can be increased (from a design perspective) to achieve the characteristic.

In the context of various embodiments, the term "transparent" would be understood to refer to characteristics relating to the passage of at least some light. For example, different transparent materials (in accordance with different embodiments) exhibit different levels of transparency, which can range between passing 30% to 100% of light incident thereupon. In many optoelectronic implementations, transparent conductors pass between about 60% and 90% of light incident upon the conductors, as may be dictated by the application.

In connection with various example embodiments, a solution-processed film includes a silver nanowire mesh laminated and transferred to thin, solution-processed polymer film to form a composite, conductive film with transparency characteristics. The lamination of the mesh can be used to obtain a smooth surface. In some implementations, these films are used with solar cell and display applications, and exhibit mechanical flexibility upon implementation (e.g., during operation of a display).

In certain embodiments, a solution-processed low-cost flexible transparent electrode is used in applications involving indium-tin oxide (ITO) films. Such applications include optoelectronic devices. Transparent electrode films as described herein can be used in place of these ITO films. High quality devices can be made using these films, and achieve comparable performance to ITO in all metrics while having lower cost and improved mechanical properties.

A variety of different types of flexible materials, or combinations thereof, are used to support nanowire meshes, such as silver nanowire meshes, in accordance with different example embodiments. Polymer films are used in many implementations, and may include, for example, Poly(3,4-ethylenedioxythiophene) poly(styrenesulfonate) (PEDOT:PSS) and poly(methylmethacrylate) (PMMA) are example types of polymers that can be used in connection with one or more example embodiments. Other polymers, polymer-based combinations, or non-polymer films exhibiting similar characteristics are used, in certain embodiments. Accordingly, various aspects are directed to films having one or more characteristics as follows: optical transparency in the visible spectrum in the range of wavelengths of light from 400 nm to 800 nm; mechanically bendable under small (e.g., about 1 mm) bending radii without cracking; bulk mechanical indentation hardness in the 100 MPa to 300 MPa range; controllable deposition characteristics for forming a thin film on a substrate in thicknesses ranging from 100 nm to 500 nm; and mechanically compressible up to about 60,000 psi.

In some embodiments, a flexible display and/or touch screen type of device includes an embedded mesh as discussed herein, and processing circuitry configured to detect a bending characteristic of the mesh. For example, by detecting an electrical characteristic or a change in an electrical characteristic, the device may detect a bend at a particular location of the film. This information is used for one or more of a variety of approaches, such as controlling an image displayed on the flexible device, or processing touch inputs received at and/or adjacent the bend.

Nanowire mesh films as described herein may be implemented in connection with many different types of devices, in accordance with various example embodiments. For example, thin film solar cells, displays such as LCDs, organic light-emitting displays, electrophoretic displays, touch screens (e.g., capacitive or resistive), anti-fog devices such as in automotive and aeronautic windshields, and flexible flatpanel lighting (e.g., using evaporated and/or printed white organic light-emitting diodes) can be formed using materials and/or approaches as described herein.

Nanowire-based polymer films are formed using one or more of a variety of approaches, which may include aspects (or all) of one or more approaches as shown in and described in connection with the Appendices filed in the underlying provisional patent application, and that form part of this patent document. Other embodiments involve different nanowire deposition or coupling processes for forming one or more layers of such a film. Some applications are directed to a nanowire transfer approach, while others are directed to drop-cast or spraying approaches in which nanowires are formed and/or set on a polymer surface, and then embedded where appropriate. For instance, relative to the various embodiments shown in the aforesaid Appendices, other embodiments are directed to depositing nanowires after the formation of an underlying (e.g., polymer) structure, then pressing or otherwise processing the nanowires to embed the nanowires into the underlying structure, or to otherwise couple the nanowires with the underlying structure. Other applications involve using other substrates in place of or in addition to a polymer-based film, such as those including glass or other materials useful for particular applications. In still other embodiments, nanowires are deposited upon an underlying polymer-based film using one or more of electrochemical deposition, vapor-phase deposition, or solution deposition.

In connection with other example embodiments, transparent electrodes are formed using a nanowire mesh and polymer film composite for organic photovoltaic cells, flexible displays and/or touch screens. In some implementations, the composite structures exhibit and/or are characterized by a yield strain that is at least four times higher than that of indium tin oxide, resulting in robust, flexible optoelectronic devices. In various contexts, the term yield strain generally refers to a point or condition at which plastic deformation begins, such as in a composite structure undergoing elastic bending (e.g., as measured by a change in resistivity as indicative of plastic deformation, or a break). In the table below, exemplary characteristics of various solution-processed transparent conductors are shown, as well as ITO on two different substrates, as relevant to one or more example embodiments.

| Transparent Conductor | Rs W/sq | % Transmission | OPV Cell Performance |
|---|---|---|---|
| ITO on glass | 20 | 90 | >4% (P3HT:PCBM) |
| ITO on PET | 42 | 91 | 3.66% (P3HT:PCBM)[1] |
| PEDOT PH750 + 5% DMSO | 102 | 84 (at 500 nm) | 3.5% (P3HT:PCBM)[2] |
| Carbon Nanotubes (CNT) | 200 | 85 | 2.5% (P3HT:PCBM)[3] |
| Graphene (solution) | 5000 | 80 | 0.4% (CuPc:C60)[4] |
| Graphene + CNT | 240 | 86 | 0.85% (P3HT:PCBM)[5] |
| Ag Nanowires | 10 | 85 | 0.4% (CuPc:PTCBI)[6] |
| Composite on glass | 12 | 86 | 4.2% (P3HT:PCBM) |
| Composite on PET | 17 | 83 | 3.8% (P3HT:PCBM) |

The data for the composites in the table show desirable performance relative to other ITO replacement materials, and relative to ITO on plastic. These materials can be used with organic photovoltaic cells, as well as flexible displays.

In many implementations, sheet resistance achieved via the control of surface roughness is used to facilitate a desirable fill factor of about 0.64 in a photovoltaic cell application, and an efficiency of about 3.8% (e.g., using PEDOT:PSS/Ag nanowires on plastic). The fill factor, in this context, pertains to the ratio of actual maximum obtainable power, ($V_{mp} \times J_{mp}$) to theoretical power ($J_{sc} \times V_{oc}$), which may relate to solar cell performance, where $J_{mp}$ and $V_{mp}$ represent the current density and voltage at a maximum power point obtained by varying the resistance in the circuit until J×V is at its greatest value.

Various other example embodiments are directed to one or more aspects as described in Appendices A and B of the underlying provisional patent document to which priority is claimed above and which is fully incorporated herein by reference. Similarly, various embodiments are directed to one or more approaches as described in Gaynor, et al., "A High-Performance Solution-Processed Composite Indium Tin Oxide Replacement for Optoelectronic Devices," as submitted to Advanced Materials, attached hereto and fully incorporated herein by reference.

Turning now to the figures, FIGS. 1A-1D show a nanowire mesh type device undergoing manufacture, according to another example embodiment of the present invention. Beginning with FIG. 1A, a nanowire suspension 102 is applied to a glass transfer block 100. The suspension may be applied, for example, by mixing nanowires in a solution and coating or depositing the solution on the glass transfer block 100. Other embodiments are directed to such an approach with different types of transfer block.

Figure 1B:
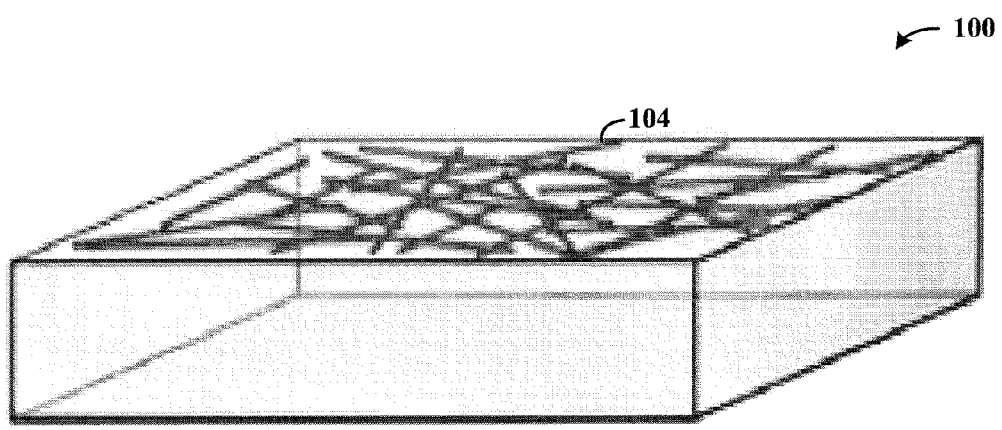
FIG. 1B shows a nanowire mesh on a substrate.

In FIG. 1B, the nanowire suspension 102 has been processed (e.g., allowed to disperse) to form a nanowire mesh 104. The nanowire mesh includes a plurality of electrically coupled nanowires, and may be arranged in accordance with one or more example embodiments as discussed herein.

Figure 1C:
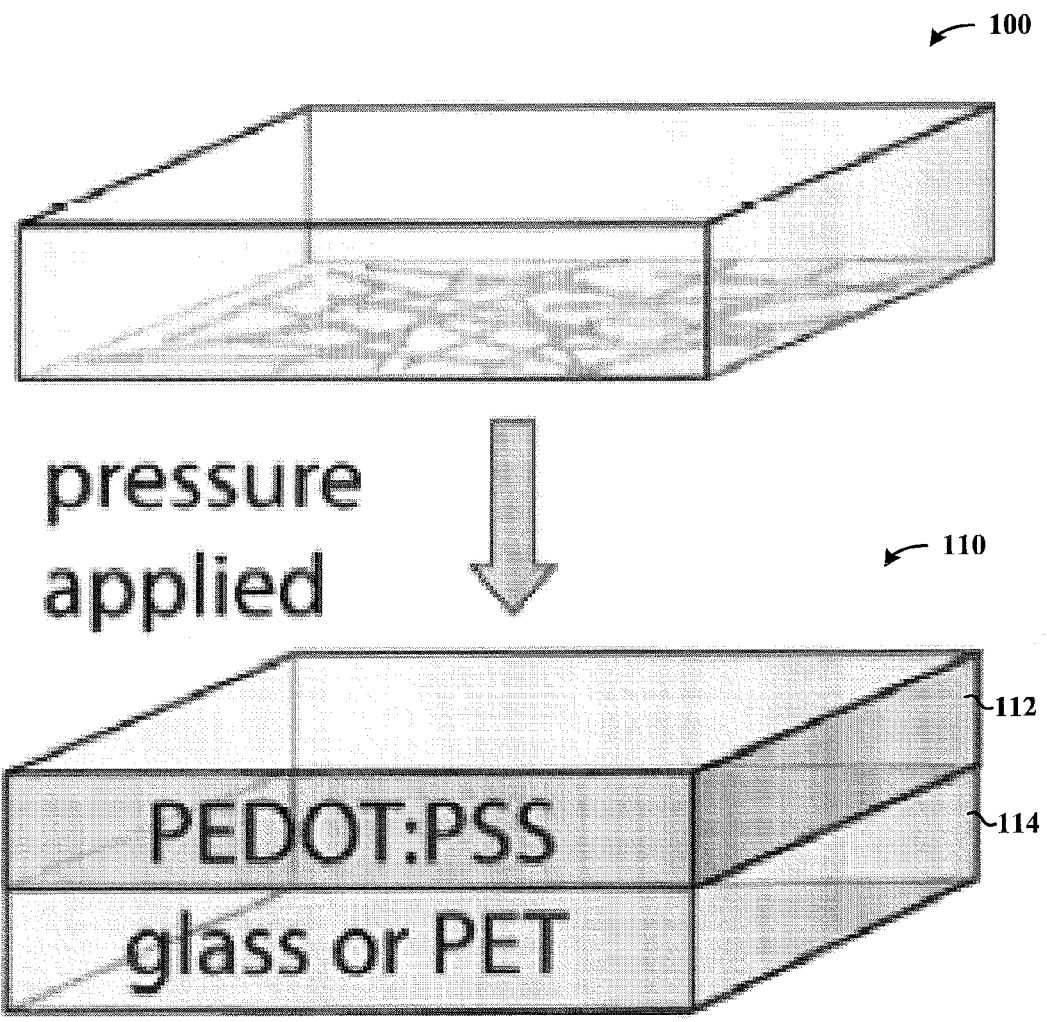
FIG. 1C shows a substrate with nanowire mesh positioned for embedding in a PEDOT:PSS material on a glass or PET substrate.
Figure 1D:
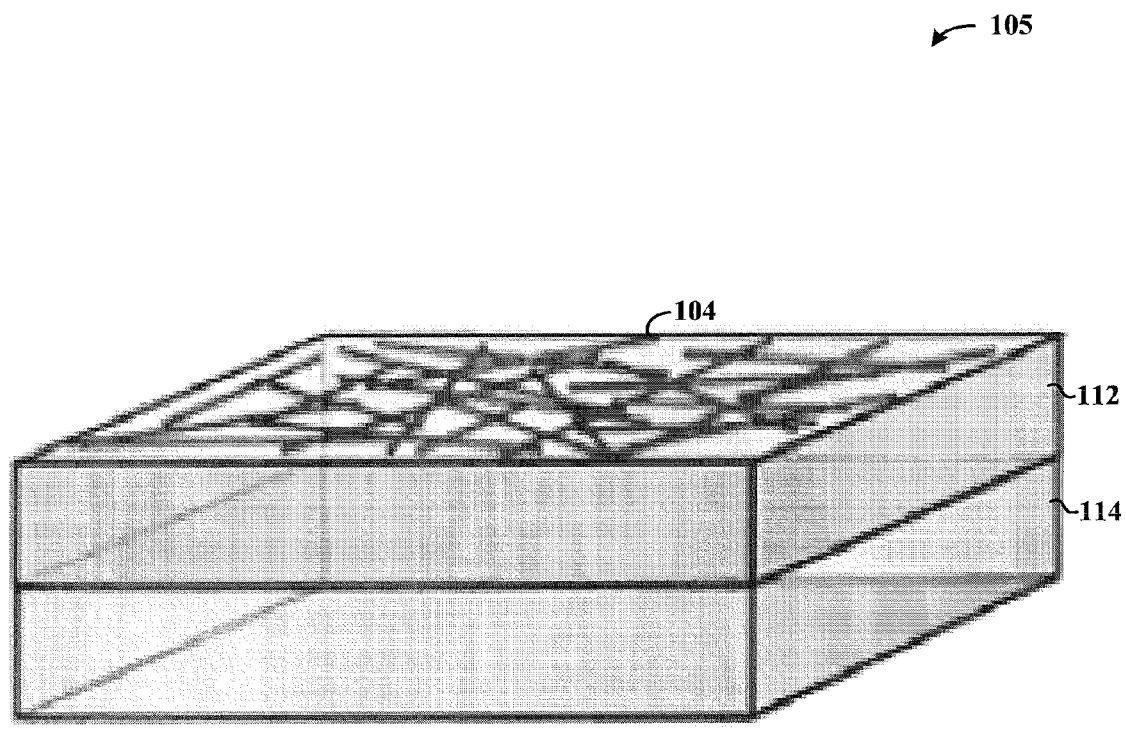
FIG. 1D shows a nanowire mesh embedded in a material layer.

In FIG. 1C, the transfer block 100 is pressed to a substrate 110 including an embedding material 112 (e.g., PEDOT:PSS) on an underlying support structure 114 (e.g., glass or PET). The embedding material 112 may, for example, be formed via spin-casting on the support structure 114. In FIG. 1D, the resulting device 105 includes a nanowire mesh 104 embedded in the PEDOT:PSS material 112.

In some implementations, films of nanowires with varying diameters (e.g., ranging between 50-100 diameters) are drop-cast from suspension on to the glass transfer block 100. Accordingly, diameters of nanowires in the film may vary from one another, with differences upwards of 40 nanometers. These varying diameters may cause a resulting surface roughness of the nanowire mesh that can be undesirable (e.g., ranging above 40 nm). The film is embedded in the embedding material 112 to reduce the resulting surface roughness, filling in spaces between the nanowire mesh and, in various embodiments, achieving a surface roughness that is less than 40 nanometers RMS, and in other implementations, less than about 20 nanometers RMS.

Figure 2:
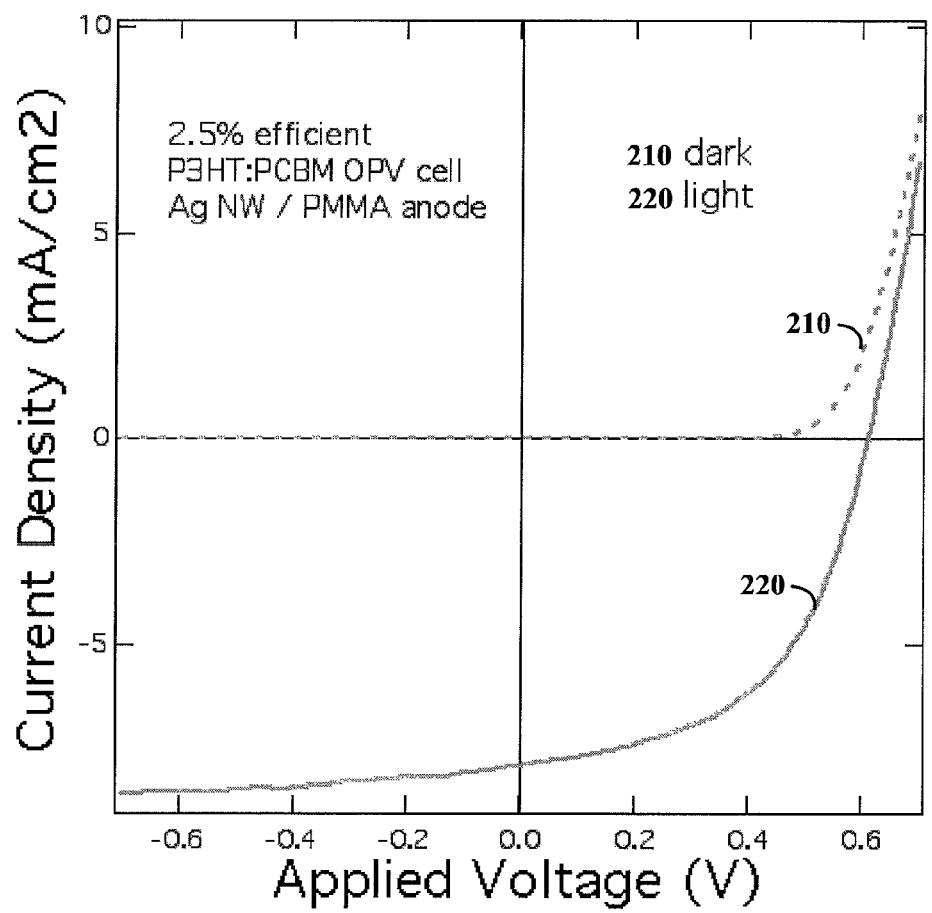
FIG. 2 shows a plot with operational characteristics of a nanowire mesh type device, in accordance with another example embodiment of the present invention.

FIG. 2 shows a plot showing operational characteristics of a nanowire mesh type device, in accordance with another example embodiment of the present invention. Specifically, plots 210 and 220 show exemplary data for an organic photovoltaic cell having a polymer-nanowire electrode with poly (methylmethacrylate) (PMMA) as the base film. Many embodiments are directed to using such a film with characteristics as shown, while other embodiments are directed to implementations using such a combination with different characteristics than those represented in the plot (e.g., with a different arrangement and/or additional materials).

Plot 210 shows behavior of the device in the dark, and plot 220 shows behavior of the device in the light. For example, 100 mW/cm$_2$ of AM 1.5G illumination can be used to illuminate the device. The current density is shown on the vertical axis, with applied voltage shown on the horizontal axis. As can be seen, the current density increases dramatically at about 0.5 V, for both light and dark applications.

Figure 3:
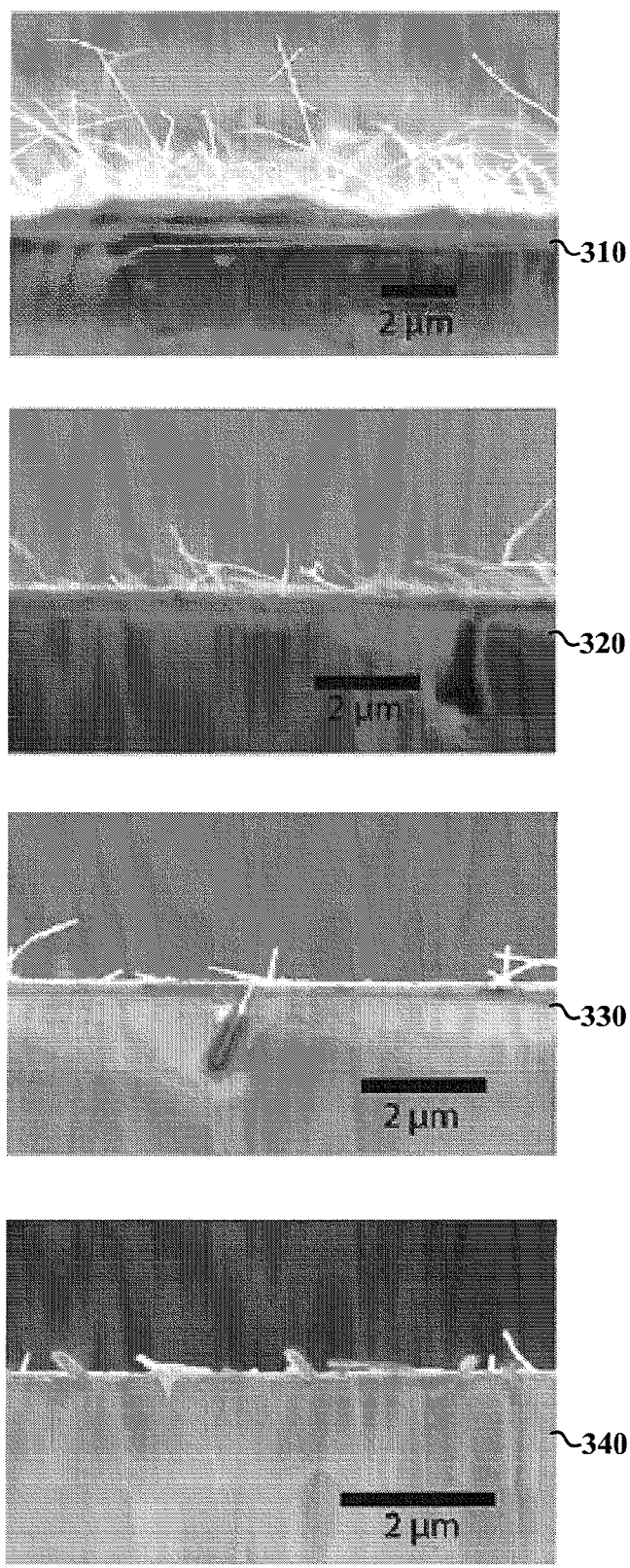
FIG. 3 shows nanowires embedded in a substrate to different degrees, in accordance with other example embodiments of the present invention.

FIG. 3 shows nanowires embedded in a substrate of different thickness, in accordance with other example embodiments of the present invention. Cross-sections 310, 320, 330 and 340 respectively show scanning electron micrographs (SEMs) of nanowires embedded into four different thicknesses of PEDOT:PSS, the respective thicknesses being about 25 nm, 50 nm, 75 nm, and 100 nm. In connection with various embodiments, it has been discovered via the cross-sectional SEMs, that as the PEDOT:PSS thickness increases, the composite morphology changes dramatically. On 25 nm of PEDOT:PSS, the nanowires transfer to the PEDOT:PSS but do not sink into the polymer along their lengths, resulting in a forest-like structure. As the PEDOT:PSS layer increases to 50, 75 and 100 nm, the wires sink into the PEDOT:PSS and the meshes become flatter, the polymer filling the deep spaces between the wires. In connection with various embodiments, the thickness of material in which nanowire meshes are embedded is set to create a flat film to suit a particular application (e.g., for use as electrodes), such as by forming a PEDOT:PSS substrate to a thickness that is sufficient to embed both single wires and the wire junctions that facilitate conductivity. Embedding the junctions in this manner can be used to facilitate maintaining upper wires flush, and therein facilitate OPV (organic photovoltaic) performance. Further, embedding the junctions with roughness protruding away from a bulk heterojunction in a device can be used to mitigate or prevent undesirable current pathways via nanostructures protruding toward the heterojunction.

Figure 4:
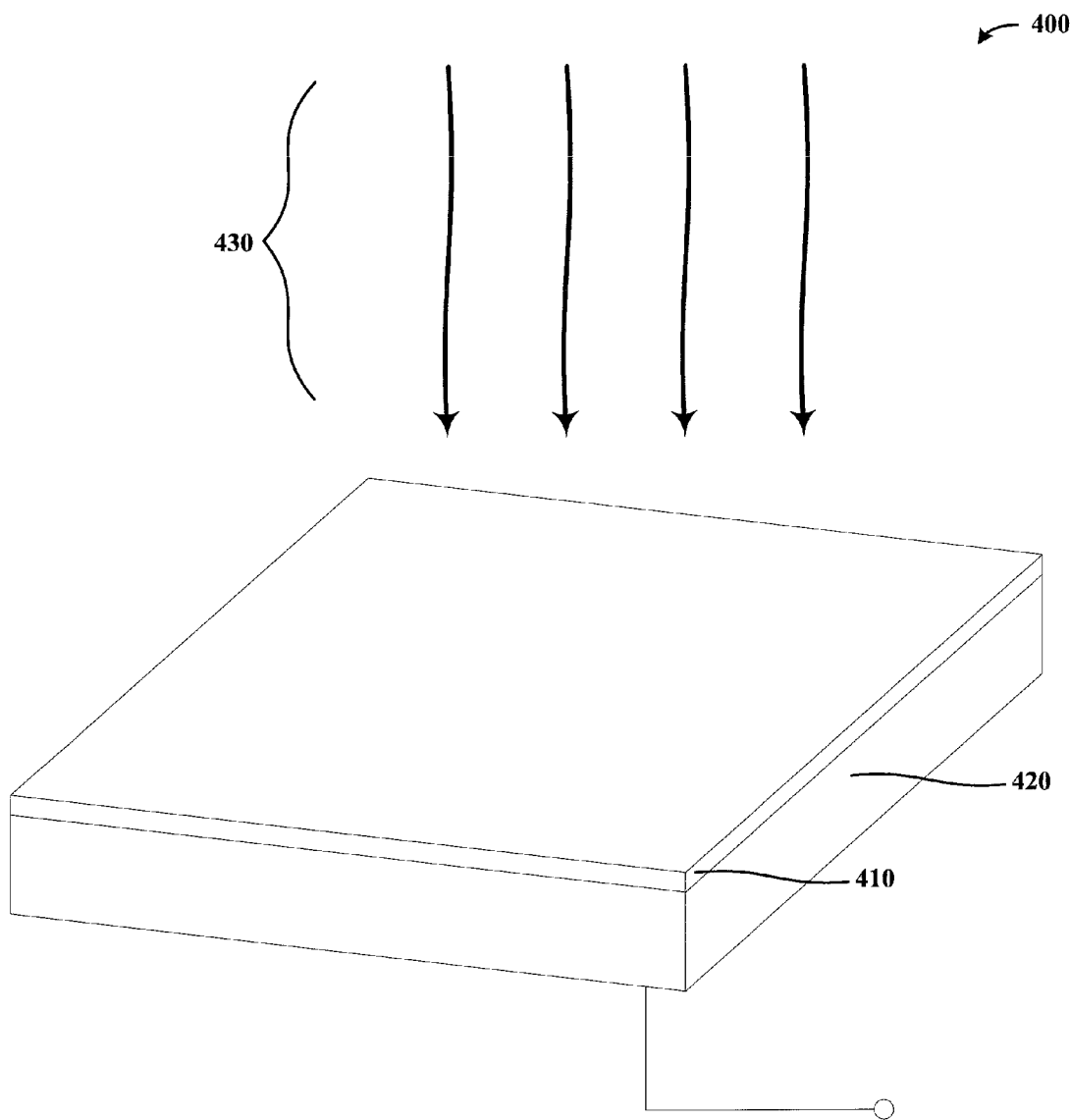
FIG. 4 shows a thin-film solar cell device having a nanowire mesh-based transparent conductive layer, in accordance with another example embodiment of the present invention.

FIG. 4 shows a thin-film solar cell device 400 having a nanowire mesh-based transparent conductive layer 410, in accordance with another example embodiment of the present invention. The transparent conductive layer 410 is located over an underlying semiconductor material layer 420 including photovoltaic regions for generating current in response to incident light (430), which the transparent conductive layer 410 is configured to pass through to the underlying semiconductor material layer.

The transparent conductive layer 410 includes a nanowire mesh embedded into a material such as a conducting polymer, as discussed herein, to reduce surface roughness of the film as attributed to non-embedded portions of the mesh. This resulting surface roughness can be used to promote conductivity characteristics of the mesh while mitigating issues, for example, relating to interaction of the nanowire mesh with an underlying junction region in the semiconductor material layer 420.

In various implementations, the transparent conductive layer 410 is configured to exhibit electrical conductivity characteristics that can be achieved at various degrees of bending stress, facilitating the application of the device 400 with implementations either subject to, or explicitly arranged with, bending of the conductive layer 410 (e.g., at stresses as discussed herein).

Figure 5:
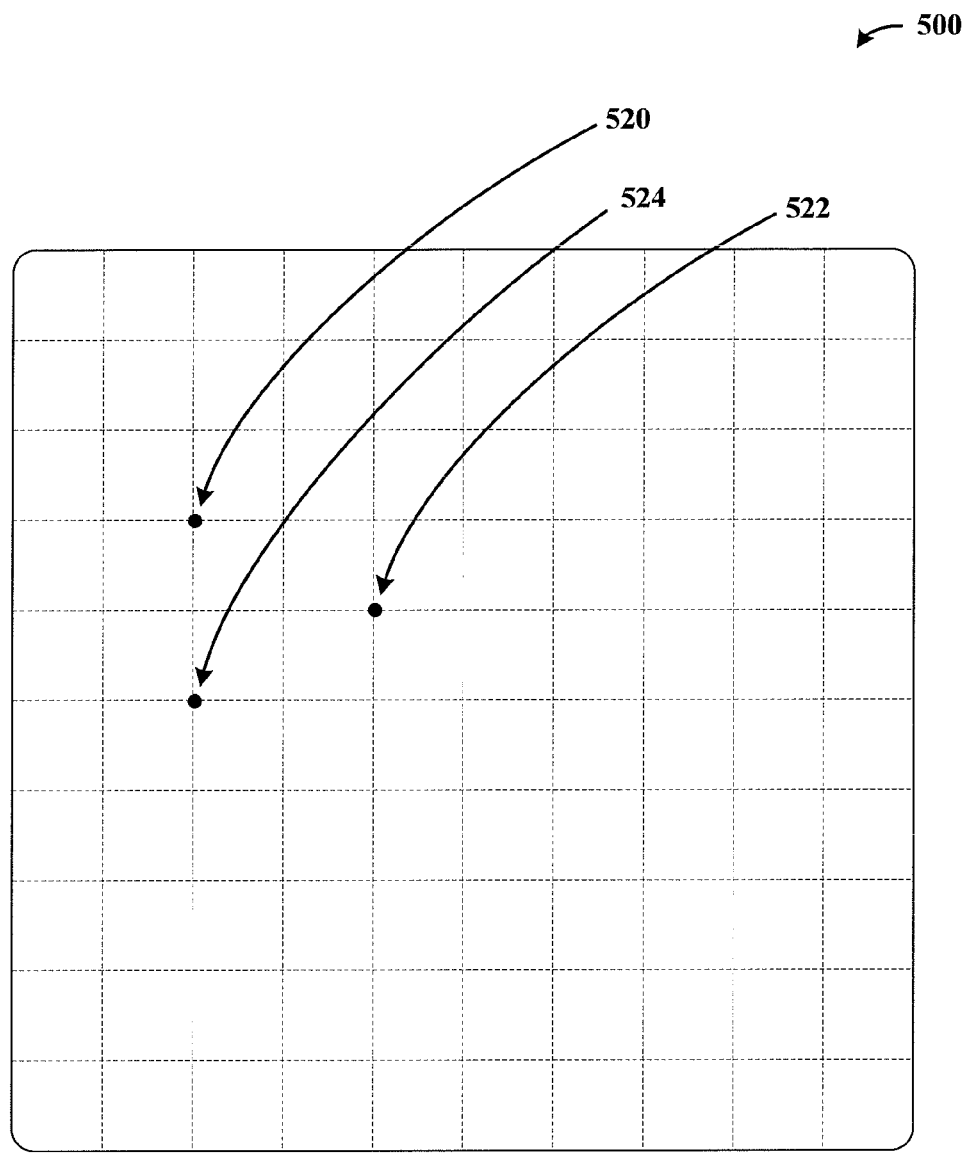
FIG. 5 shows a touch screen device having a nanowire mesh-based transparent conductive layer, in accordance with another example embodiment of the present invention.
Figure 5:
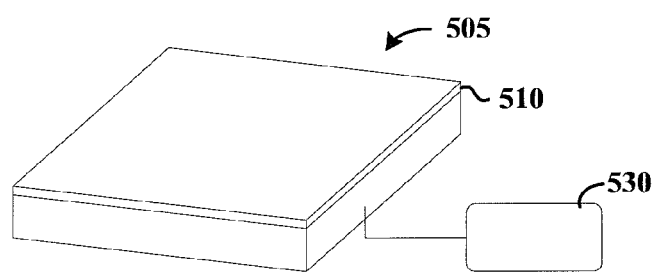

FIG. 5 shows a top view of a touch screen device 500 having a nanowire mesh-based transparent conductive layer at an upper surface (as shown), in accordance with another example embodiment of the present invention. Inset 505 shows a perspective view of an exemplary implementation of the touch screen device 500, with the nanowire mesh-based transparent conductive layer 510 located at an upper portion of the device 500.

The transparent conductive layer 510 includes an embedded nanowire mesh as discussed herein, with most or substantially all of the mesh being embedded in a film. The embedding facilitates relatively low surface roughness which, in turn, facilitates desirable conductivity characteristics of the touch screen. Further, the transparent conductive layer 510 is configured to exhibit electrical conductivity characteristics that can be achieved at various degrees of bending stress (e.g., as discussed herein). This facilitates touch-inputs at the transparent conductive layer 510 that may involve significant bending, as well as application of the device 500 under conditions in which the touch screen device 500 is configured with bending (e.g., with a curved touch screen).

By way of example, the touch screen device 500 is shown having grid lines representing regions of touch input, with exemplary touch points 520, 522 and 524 labeled by way of example, each touch point being centered upon one of the grid locations. The location and relative sizing of the grid lines is for exemplification, with the understanding that such grid locations and touch points may be spaced at a significantly smaller pitch relative to one another, for higher resolution with respect to detecting touch inputs. The bending tolerance of the transparent conductive layer 510, with respect to related conductivity, facilitates the detection of touch input positions at each of the respective touch points 520, 522 and 524.

In some implementations, the device 500 includes a logic circuit 530, coupled to the conductive layer 510 for receiving information regarding the detected touch point positions. The logic circuit 530 further controls the display of an image, which may be effected in a portion of the film in which the mesh is embedded and/or via other display components that display an image via (through) the conductive layer 510.

A variety of deposition approaches may be implemented for fabricating electrodes as discussed herein, in accordance with various example embodiments. Wet processes that can be used to fabricate one or more electrode layers include, spin-coating, spray-coating, drop-casting, ink jet printing, flexographic printing, gravure printing, silk-screening, die-slot coating and roll-to-roll printing.

Various embodiments described above, in the Appendices filed in the underlying provisional application (which form part of this patent document) and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the present invention.

What is claimed is:

1. An apparatus comprising:
    an organic substrate layer; and
    an inorganic nanowire mesh embedded in the organic substrate layer, the organic substrate layer being configured with the embedded nanowire mesh to provide a composite morphology for nanowires therein being sufficiently flattened to form a conductive film in which some of the nanowires are exposed and at which RMS surface roughness is between 5 nm and 30nm, wherein the organic substrate layer and the inorganic nanowire mesh form an organic-inorganic compound conductive film having a surface roughness value that is at least 25% lower than a surface roughness of the inorganic nanowire mesh, prior to embedding in the organic substrate layer.

2. The apparatus of claim 1, wherein the organic substrate layer has a thickness of at least about the thickness of the inorganic nanowire mesh.

3. The apparatus of claim 1, wherein the inorganic nanowire mesh and organic substrate layer form a film that passes at least about 70% of light incident thereupon.

4. The apparatus of claim 1, wherein at least 25% of the nanowire mesh is embedded within the organic substrate layer.

5. The apparatus of claim 1, wherein:
the organic substrate layer has a thickness of at least about the thickness of the inorganic nanowire mesh; and
the inorganic nanowire mesh and organic substrate layer form a film that passes at least about 70% of light incident thereupon.

6. An apparatus comprising:
an organic substrate layer; and
an inorganic nanowire mesh embedded in the organic substrate layer, the organic substrate layer with the embedded nanowire mesh forming a conductive film, wherein the inorganic nanowire mesh includes a plurality of silver nanowires having diameters that are at least about 40 nanometers different than diameters of other silver nanowires in the mesh, and the organic substrate layer and inorganic nanowire mesh form a film having an RMS surface roughness of less than about 20 nanometers.

7. An apparatus comprising:
an organic substrate layer; and
an inorganic nanowire mesh embedded in the organic substrate layer, the organic substrate layer with the embedded nanowire mesh forming a conductive film, wherein the organic substrate layer is a polymer having a high refractive index configured to extend the spectral range over which the inorganic nanowire mesh is transparent into the infrared.

8. An apparatus comprising:
an organic substrate layer; and
an inorganic nanowire mesh embedded in the organic substrate layer, the organic substrate layer with the embedded nanowire mesh forming a conductive film, wherein the organic substrate layer includes a polymer having a high refractive index configured to, for incident light of a wavelength that is too long for passing through openings in the nanowire mesh, modify the wavelength of the incident light to permit the light to pass through openings in the inorganic nanowire mesh.

9. An apparatus comprising:
an organic substrate layer; and
an inorganic nanowire mesh embedded in the organic substrate layer, the organic substrate layer with the embedded nanowire mesh forming a conductive film, wherein the conductive film is configured to exhibit a conductivity value that is about constant under bending stresses ranging from no bending stress to a bending stress that is about four times a bending stress at which an indium tin oxide film, having dimensions corresponding to the conductive film, exhibits plastic deformation.

10. An apparatus comprising:
an organic substrate layer; and
an inorganic nanowire mesh embedded in the organic substrate layer, the organic substrate layer being configured with the embedded nanowire mesh to provide a composite morphology for nanowires therein being sufficiently flattened to form a conductive film in which some of the nanowires are exposed and at which RMS surface roughness is between 5 nm and 30 nm, wherein the organic substrate layer fills in gaps between nanowires in the nanowire mesh, electrically couples portions of the nanowire mesh, and the film surface has an RMS roughness that is less than about half a RMS roughness of the nanowire mesh, prior to embedding.

11. An apparatus comprising:
an organic substrate layer;
embedded in the organic substrate layer, a plurality of electrodes and an inorganic nanowire mesh, the organic substrate layer being configured with the embedded nanowire mesh to provide a composite morphology for nanowires therein being sufficiently flattened to form a conductive film in which some of the nanowires are exposed and at which RMS surface roughness is between 5 nm and 30 nm;
each electrode comprising
the inorganic nanowire mesh embedded in the organic substrate layer, to a depth in the organic substrate layer at which the organic substrate layer and the inorganic nanowire mesh form a conductive film having the RMS surface,
a portion of the organic substrate layer between spaces in the mesh that is configured and arranged to electrically couple portions of the mesh; and
logic circuitry configured to control the display of an image via the organic substrate layer; and
wherein the composite morphology is characterized in the nanowires being flattened due to the depth of the organic substrate layer.

12. A display device comprising:
an organic substrate layer;
embedded in the organic substrate layer, a plurality of electrodes, each electrode comprising:
an inorganic nanowire mesh embedded to a depth in the organic substrate layer at which the organic substrate layer and the inorganic nanowire mesh form a conductive film having a surface roughness value that is at least 25% lower than a surface roughness of the inorganic nanowire mesh, prior to embedding in the organic substrate layer, and
a portion of the organic substrate layer between spaces in the mesh that is configured and arranged to electrically couple portions of the mesh; and
logic circuitry configured to control the display of an image via the organic substrate layer, wherein the organic substrate layer and embedded electrodes form a touchscreen configured to provide an output indicative of the presence and location of a touch on the screen.

13. A display device comprising:
an organic substrate layer;
embedded in the organic substrate layer, a plurality of electrodes, each electrode comprising:
an inorganic nanowire mesh embedded to a depth in the organic substrate layer at which the organic substrate layer and the inorganic nanowire mesh form a conductive film having a surface roughness value that is at least 25% lower than a surface roughness of the inorganic nanowire mesh, prior to embedding in the organic substrate layer, and
a portion of the organic substrate layer between spaces in the mesh that is configured and arranged to electrically couple portions of the mesh; and
logic circuitry configured to control the display of an image via the organic substrate layer, wherein the logic circuitry is configured to
detect a bend in the film in response to an electrical characteristic of the at least one of the plurality of electrodes, and
control the display of the image based on the detected bend.

14. An apparatus comprising:

an organic substrate layer; and an inorganic nanowire mesh embedded in the organic substrate layer, the organic substrate layer being configured with the embedded nanowire mesh to provide a composite morphology for nanowires therein being sufficiently flattened to form a conductive film in which some of the nanowires are exposed and at which RMS surface roughness is between 5 nm and 30 nm, wherein the organic substrate layer fills in gaps between nanowires in the nanowire mesh, electrically couples portions of the nanowire mesh, and the film surface has an RMS roughness that is less than about half a RMS roughness of the nanowire mesh, prior to embedding; and the organic substrate layer and the inorganic nanowire mesh form an organic-inorganic compound conductive film having a surface roughness value that is at least 25% lower than a surface roughness of the inorganic nanowire mesh, prior to embedding in the organic substrate layer.

15. An apparatus comprising:

an organic substrate layer; and an inorganic nanowire mesh embedded in the organic substrate layer, the organic substrate layer being configured with the embedded nanowire mesh to provide a composite morphology for nanowires therein being sufficiently flattened to form a conductive film in which some of the nanowires are exposed and at which RMS surface roughness is between 5 nm and 30nm, wherein the organic substrate layer has a thickness of at least about the thickness of the inorganic nanowire mesh; and the inorganic nanowire mesh and organic substrate layer form a film that passes at least about 70% of light incident thereupon;

wherein the organic substrate layer fills in gaps between nanowires in the nanowire mesh, electrically couples portions of the nanowire mesh, and the film surface has an RMS roughness that is less than about half a RMS roughness of the nanowire mesh, prior to embedding; and the organic substrate layer and the inorganic nanowire mesh form an organic-inorganic compound conductive film having a surface roughness value that is at least 25% lower than a surface roughness of the inorganic nanowire mesh, prior to embedding in the organic substrate layer.

16. An apparatus comprising:

an organic substrate layer; and an inorganic nanowire mesh embedded in the organic substrate layer, the organic substrate layer with the embedded nanowire mesh forming a conductive film, wherein:

the organic substrate layer includes a polymer having a high refractive index configured to, for incident light of a wavelength that is too long for passing through openings in the nanowire mesh, modify the wavelength of the incident light to permit the light to pass through openings in the inorganic nanowire mesh; and the conductive film is configured to exhibit a conductivity value that is about constant under bending stresses ranging from no bending stress to a bending stress that is about four times a bending stress at which an indium tin oxide film, having dimensions corresponding to the conductive film, exhibits plastic deformation.

* * * * *